(12) United States Patent
Ohno et al.

(10) Patent No.: US 9,059,027 B2
(45) Date of Patent: Jun. 16, 2015

(54) SEMICONDUCTOR DEVICE

(71) Applicant: Kabushiki Kaisha Toshiba, Minato-ku, Tokyo (JP)

(72) Inventors: Tetsuya Ohno, Nomi (JP); Kunio Tsuda, Nonoichi (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 0 days.

(21) Appl. No.: 14/201,656

(22) Filed: Mar. 7, 2014

(65) Prior Publication Data
US 2015/0069615 A1 Mar. 12, 2015

(30) Foreign Application Priority Data

Sep. 12, 2013 (JP) ................... 2013-189752

(51) Int. Cl.
*H01L 29/66* (2006.01)
*H01L 25/10* (2006.01)

(52) U.S. Cl.
CPC ...................... *H01L 25/10* (2013.01)

(58) Field of Classification Search
USPC ......... 257/194, 621, 434, 632, 684, 635, 686, 257/689
See application file for complete search history.

(56) References Cited

U.S. PATENT DOCUMENTS

| | | | |
|---|---|---|---|
| 7,180,149 B2 * | 2/2007 | Yamamoto et al. | 257/434 |
| 7,538,394 B2 * | 5/2009 | Asano | 257/355 |
| 7,622,776 B2 * | 11/2009 | Kawasaki | 257/361 |
| 7,919,835 B2 * | 4/2011 | Akiyama | 257/621 |
| 8,513,119 B2 * | 8/2013 | Chang et al. | 438/667 |
| 2005/0067693 A1 * | 3/2005 | Nihei et al. | 257/720 |
| 2005/0101040 A1 * | 5/2005 | Lai et al. | 438/21 |
| 2007/0176201 A1 | 8/2007 | Beach et al. | |
| 2009/0014881 A1 * | 1/2009 | Endo et al. | 257/758 |
| 2012/0153355 A1 | 6/2012 | Umeda et al. | |

(Continued)

FOREIGN PATENT DOCUMENTS

| | | |
|---|---|---|
| JP | 06-151846 A | 5/1994 |
| JP | 2000-260772 A | 9/2000 |
| JP | 2008-047559 A | 2/2008 |

(Continued)

OTHER PUBLICATIONS

Naoya Okamoto et al., "Backside Process Considerations for Fabricating Millimeter-Wave GaN HEMT MMICs" pp. 257 (May 2010).

(Continued)

*Primary Examiner* — Mohammed Shamsuzzaman
(74) *Attorney, Agent, or Firm* — White & Case LLP

(57) ABSTRACT

In one embodiment, a semiconductor device includes first and second semiconductor layers of a first conductivity type above a substrate via a first film, a first electrode above the second semiconductor layer, and a second electrode disposed on a side of the first electrode or an opposite side of the first electrode with respect to the second semiconductor layer. The device further includes a first pad layer connected to the first electrode, a second pad layer connected to the second electrode and including a first upper portion contacting the second electrode, a second upper portion disposed at a level between upper and lower portions of the substrate, and a third upper portion opposed to the lower portion of the substrate, and a third semiconductor layer of a second conductivity type between the second upper portion of the second pad layer and a lower portion of the first film.

9 Claims, 9 Drawing Sheets

(56) References Cited

U.S. PATENT DOCUMENTS

2014/0103539 A1* 4/2014 Min et al. .................. 257/774
2014/0203294 A1 7/2014 Therrien et al.

FOREIGN PATENT DOCUMENTS

| JP | 2009-147218 | A | 7/2009 |
| WO | 2005022631 | A1 | 3/2005 |
| WO | 2010047227 | A1 | 4/2010 |
| WO | 2011024440 | A1 | 3/2011 |

OTHER PUBLICATIONS

Olaf Krüger et al., "UV laser drilling of SiC for semiconductor device fabrication" Journal of Physics: Conference Series 59, pp. 740-744 (2007).

* cited by examiner

SEMICONDUCTOR DEVICE

CROSS REFERENCE TO RELATED APPLICATION

This application is based upon and claims the benefit of priority from the prior Japanese Patent Application No. 2013-189752, filed on Sep. 12, 2013, the entire contents of which are incorporated herein by reference.

FIELD

Embodiments described herein relate to a semiconductor device.

BACKGROUND

GaN (gallium nitride) is a nitride semiconductor material whose bandgap is larger than that of Si (silicon), and has excellent material properties such as a high saturated electron speed and a high breakdown electric field intensity. A GaN layer can form a hetero junction with a group III-V compound semiconductor layer containing an element such as Al (aluminum) or In (indium). At the hetero interface between the GaN layer and an AlGaN (aluminum gallium nitride) layer, an electron layer having a high electron concentration and a high electron mobility called two-dimensional electron gas (2 DEG) layer is generated by spontaneous polarization or piezo polarization. A high electron mobility transistor (HEMT) using such properties of the hetero junction has been attracting attention as a next-generation device to be used in a power amplifier and a switching device.

An example of requirements on the HEMT is, for example, to have high performance such as a high dielectric breakdown voltage and a high current operation. The HEMT is also required to have a reduced chip size for lowering a chip cost, and to have a wafer composition suitable for carrying out an efficient conduction test such as burn-in in a wafer state.

The GaN layer and the AlGaN layer of the HEMT are stacked on a semiconductor substrate via a buffer layer. However, the semiconductor substrate and the GaN layer are different from each other in lattice constant and thermal expansion coefficient. Therefore, the buffer layer, the GaN layer and the AlGaN layer include dislocations which are a kind of crystal defects. These dislocations cause a leakage current when a high voltage is applied to the HEMT. Furthermore, when the breakdown voltage of the HEMT is increased, carriers are generated between the semiconductor substrate and the buffer layer to form an inversion layer or an accumulation layer (which is also referred to as a conductive layer). As a result, a state like a short channel is generated between the source electrode and the drain electrode, thereby generating a leakage current. These leakage currents serve as barriers against improvements of the breakdown voltage of the HEMT.

On the other hand, a bonding pad and a bonding wire to be electrically connected to a circuit terminal of the HEMT is typically placed on the outside (periphery) of a semiconductor chip including the HEMT. If the area of the bonding pad is reduced in this configuration, the bonding position of the bonding wire may be deviated in a wire bonding process. This results in a degraded bonding strength, a contact failure of the bonding wire, an increase in resistance of the bonding wire, and the like. This makes it difficult to reduce the chip area.

DETAILED DESCRIPTION

Embodiments will now be explained with reference to the accompanying drawings.

In one embodiment, a semiconductor device includes a semiconductor substrate, a first film disposed above the semiconductor substrate, a first semiconductor layer of a first conductivity type or an intrinsic type disposed above the first film, and a second semiconductor layer of the first conductivity type or the intrinsic type disposed above the first semiconductor layer. The device further includes a control electrode disposed above the second semiconductor layer via an insulator, a first main electrode disposed above the second semiconductor layer, and a second main electrode disposed on a side of the first main electrode with respect to the second semiconductor layer, or on an opposite side of the first main electrode with respect to the second semiconductor layer. The device further includes a first pad layer electrically connected to the first main electrode. The device further includes a second pad layer electrically connected to the second main electrode, and including a first upper portion in contact with the second main electrode, a second upper portion disposed at a level between an upper portion of the semiconductor substrate and a lower portion of the semiconductor substrate, and a third upper portion opposed to the lower portion of the semiconductor substrate via an insulating layer. The device further includes a third semiconductor layer of a second conductivity type disposed between the second upper portion of the second pad layer and a lower portion of the first film.

First Embodiment

Figure 1:
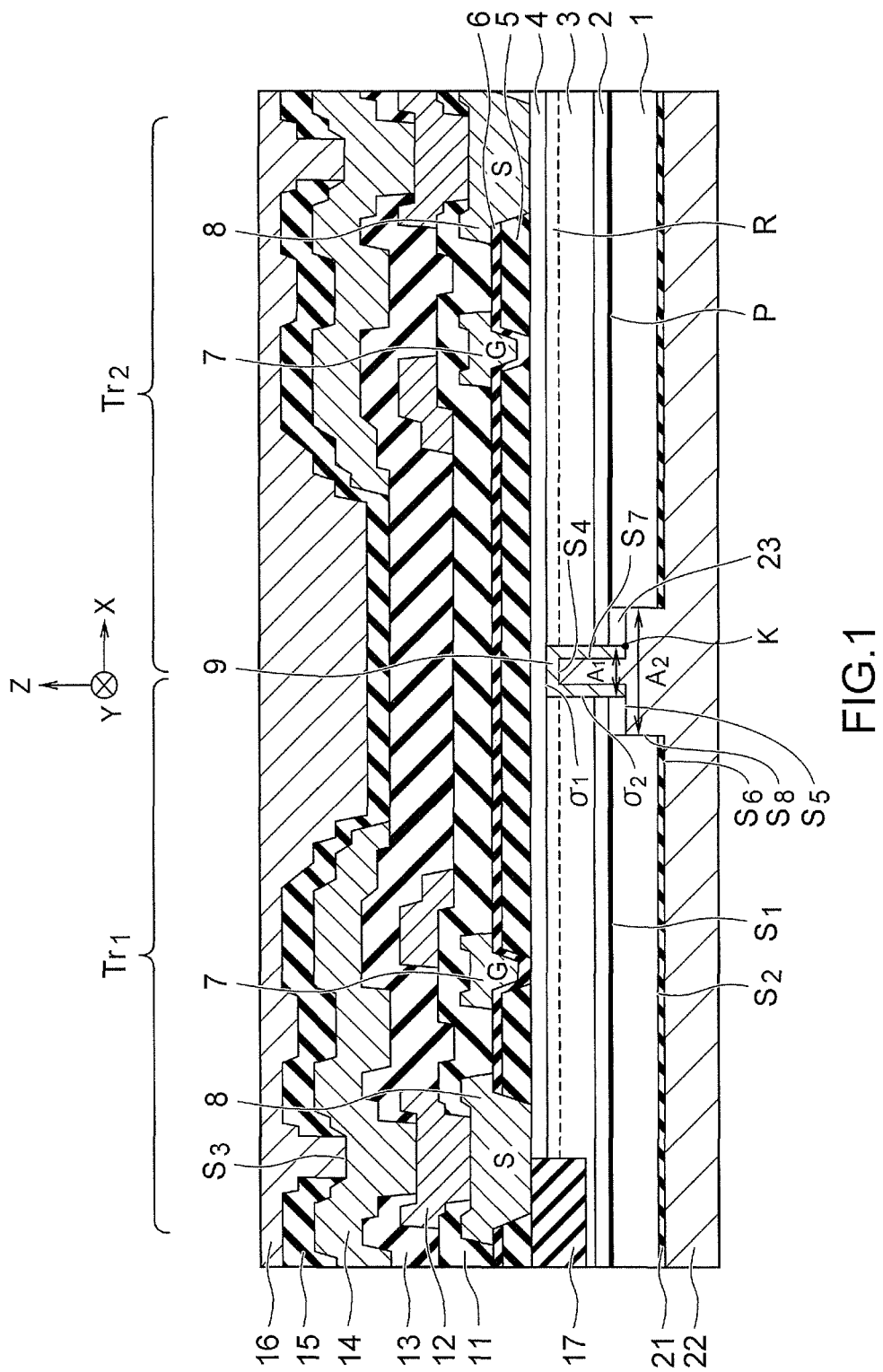
FIG. 1 is a cross-sectional view illustrating a structure of a semiconductor device of a first embodiment.

FIG. 1 is a cross-sectional view illustrating a structure of a semiconductor device of a first embodiment. FIG. 1 shows two transistors $Tr_1$ and $Tr_2$ as an example of HEMTs included in the semiconductor device.

The semiconductor device in FIG. 1 includes an n-type (or p-type) semiconductor substrate 1, a buffer layer 2 as an example of a first film, an n-type or i-type (intrinsic type) electron transit layer 3 as an example of a first semiconductor layer, an n-type or i-type electron supply layer 4 as an example of a second semiconductor layer, an insulator 5, a gate insulator 6, a gate electrode(s) 7 as an example of a control electrode, a source electrode(s) 8 as an example of a first main electrode, and a drain electrode 9 as an example of a second main electrode.

The semiconductor device in FIG. 1 further includes a first inter layer dielectric 11, a first interconnect layer 12, a second inter layer dielectric 13, a second interconnect layer 14, a third inter layer dielectric 15, a first pad layer 16, an isolation region 17, an insulating layer 21, a second pad layer 22, and a first p-type semiconductor layer 23 as an example of a third semiconductor layer.

The n-type and the p-type are respectively examples of first and second conductivity types. An i-type semiconductor layer indicates a semiconductor layer which intentionally contains no n-type or p-type impurities. The i-type semiconductor layer is also referred to as an undoped semiconductor layer.

The semiconductor substrate 1 is an n-type substrate (or p-type substrate), and includes an upper portion $S_1$ and a lower portion $S_2$. The semiconductor substrate 1 is, for example, a silicon substrate. FIG. 1 shows an X direction and a Y direction which are parallel to the upper portion $S_1$ and the lower portion $S_2$ of the semiconductor substrate 1 and perpendicular to each other, and a Z direction which is perpendicular to the upper portion $S_1$ and the lower portion $S_2$ of the semiconductor substrate 1.

In this specification, the +Z direction is treated as an upward direction, whereas the −Z direction is treated as a downward direction. For example, the positional relationship between the upper portion $S_1$ and the lower portion $S_2$ of the semiconductor substrate 1 is described that the upper portion $S_1$ of the semiconductor substrate 1 is located above the lower portion $S_2$ of the semiconductor substrate 1.

The buffer layer 2 is formed on the upper portion $S_1$ of the semiconductor substrate 1. The buffer layer 2 is, for example, a stack film including an AlN (aluminum nitride) layer, an AlGaN layer, a GaN layer and the like. The buffer layer 2 may be doped with carbon atoms.

The electron transit layer 3 is formed on the buffer layer 2. The electron transit layer 3 is, for example, an n-type or i-type GaN layer. A symbol R denotes a region where a 2 DEG layer is produced at an upper end of the electron transit layer 3.

The electron supply layer 4 is formed on the electron transit layer 3. The electron supply layer 4 is, for example, an n-type or i-type AlGaN layer.

The insulator 5 is formed on the electron supply layer 4, and has a plurality of openings. The gate electrode 7 is formed on the electron supply layer 4 in an opening via the gate insulator 6. The source electrode 8 is formed directly on the electron supply layer 4 in an opening, and electrically connected to the electron supply layer 4 to form ohmic contact.

The drain electrode 9 is formed on an opposite side of the source electrode 8 with respect to the electron supply layer 4, and electrically connected to the electron supply layer 4 to form ohmic contact. More specifically, although the source electrode 8 is placed in the +Z direction of the electron supply layer 4, the drain electrode 9 is placed in the −Z direction of the electron supply layer 4. The drain electrode 9 includes an upper portion $\sigma_1$ in contact with a lower portion of the electron supply layer 4, the electron transit layer 3, the buffer layer 2, and a side portion $\sigma_2$ in contact with a side portion of the first p-type semiconductor layer 23. The drain electrode 9 has ohmic contact with the 2 DEG layer in the electron transit layer 3. The gate electrode 7, the source electrode 8, and the drain electrode 9 are shaped to extend in the Y direction.

The first inter layer dielectric 11, the first interconnect layer 12, the second inter layer dielectric 13, the second interconnect layer 14, the third inter layer dielectric 15, and the first pad layer 16 are sequentially formed on the electron supply layer 4 via the gate electrode 7 and the source electrode 8.

The first interconnect layer 12 includes a plurality of interconnects electrically connected to the gate electrode 7 and the source electrode 8. The second interconnect layer 14 includes a plurality of interconnects electrically connected to the gate electrode 7 and the source electrode 8 via the first interconnect layer 12.

The first pad layer 16 includes a lower portion $S_3$ in contact with the second interconnect layer 14, and is electrically connected to the source electrode 8 via the first and second interconnect layers 12 and 14. The first pad layer 16 is, for example, a conductive metal layer.

The isolation region 17 includes a side portion in contact with the electron transit layer 3 and the electron supply layer 4, a lower portion in contact with the electron transit layer 3, and an upper portion in contact with the insulator 5 and the source electrode 8. For example, the isolation region 17 is electrically inactivated by implanting ions such as argon (Ar) ions from an upper portion of the electron supply layer 4 to reach the electron transit layer 3 for electrically isolating transistors from each other.

The second pad layer 22 includes a first upper portion $S_4$ in contact with the drain electrode 9, a second upper portion $S_5$ provided at a level between the upper portion $S_1$ of the semiconductor substrate 1 and the lower portion $S_2$ of the semiconductor substrate 1, a third upper portion $S_6$ opposed to the lower portion $S_2$ of the semiconductor substrate 1 via the insulating layer 21, a first side portion $S_7$ located between the first upper portion $S_4$ and the second upper portion $S_5$, and a second side portion $S_8$ located between the second upper portion $S_5$ and the third upper portion $S_6$, and is electrically connected to the drain electrode 9. A symbol K denotes a corner located between the second upper portion $S_5$ of the second pad layer 22 and the side portion $\sigma_2$ of the drain electrode 9. The second pad layer 22 is, for example, a conductive metal layer.

A symbol $A_1$ indicates an area of a region surrounded by the side portion $\sigma_2$ of the drain electrode 9 in a vicinity of the second upper portion $S_5$. A symbol $A_2$ indicates an area of a region surrounded by the second side portion $S_8$ of the second pad layer 22 in a vicinity of the second upper portion $S_5$. In the present embodiment, the area $A_2$ is set to be larger than the area $A_1$ ($A_2 > A_1$), and is specifically set to be twice or more times as large as the area $A_1$ ($A_2 \geq 2A_1$).

The first p-type semiconductor layer 23 is formed between the second upper portion $S_5$ of the second pad layer 22 and a lower portion of the buffer layer 2. The first p-type semiconductor layer 23 is, for example, a silicon layer containing p-type impurities. The thickness of the first p-type semiconductor layer 23 in the Z direction is 1 μm or more for example, and preferably 3 μm or more.

For example, the first p-type semiconductor layer 23 can be formed by forming the insulating layer 21 on the lower portion $S_2$ of the semiconductor substrate 1, forming, in the lower portion $S_2$ of the semiconductor substrate 1, a first trench having a bottom between the upper portion $S_1$ and the lower portion $S_2$ of the semiconductor substrate 1, implanting the p-type impurities into the semiconductor substrate 1 at the bottom of the first trench, and then forming a second trench in the bottom of the first trench. In this case, the first p-type semiconductor layer 23 is a p-type semiconductor region formed in the semiconductor substrate 1. In addition, the second pad layer 22 can be formed by, for example, forming the second pad layer 22 over the entire surface of the semiconductor substrate 1 on a side of the lower portion $S_2$ after forming the first and second trenches. However, the insulating layer 21, the second pad layer 22, and the first p-type semiconductor layer 23 may be formed by other methods.

When the semiconductor substrate 1 is an n-type substrate, the p-type impurities are implanted so that the impurity concentration of the first p-type semiconductor layer 23 is set to a concentration which forms a potential barrier derived from a pn junction. On the other hand, when the semiconductor substrate 1 is a p-type substrate, the impurity concentration of the first p-type semiconductor layer 23 is preferably set to be higher than the impurity concentration of the p-type semiconductor substrate 1, to the extent that the crystallinity of the p-type semiconductor substrate 1 is not affected.

(Details of Semiconductor Device of First Embodiment)

Continuously with reference to FIG. 1, the semiconductor device of the first embodiment will be described in detail.

The semiconductor device of the present embodiment includes the first pad layer 16 formed on the upper portion $S_1$ side of the semiconductor substrate 1 and electrically connected to the source electrode 8, and the second pad layer 22 formed on the lower side $S_2$ side of the semiconductor substrate 1 and electrically connected to the drain electrode 9, and the first and second pad layers 16 and 22 are placed inside a chip of the semiconductor device.

Therefore, the present embodiment can avoid the problem that a pattern of a bonding pad cannot be reduced in the case where the bonding pad is placed outside the chip. Accordingly, the present embodiment makes it possible to reduce the chip area of the semiconductor device.

On the other hand, when a high voltage is applied to the drain electrode 9 in the present embodiment, electrons are generated at the interface between the semiconductor substrate 1 and the buffer layer 2 to form an inversion layer (or an accumulation layer, the same shall apply hereafter) P. As a result, a state like a short channel is generated between the source electrode 8 and the drain electrode 9, thereby generating a leakage current. This leakage current will flow toward chip end surfaces of the semiconductor device.

However, the semiconductor device of the present embodiment includes the first p-type semiconductor layer 23 between the second upper portion $S_5$ of the second pad layer 22 and the lower portion of the buffer layer 2, so that the semiconductor device of the present embodiment has a pn junction formed between the semiconductor substrate 1 and the first p-type semiconductor layer 23. In the present embodiment, a depletion layer which lack electrons or holes is generated at this pn junction.

Therefore, a potential barrier derived from the pn junction limits the flow of the leakage current. In other words, the potential barrier blocks the leakage path. Accordingly, the present embodiment makes it possible to suppress the flow of the leakage current caused by the inversion layer P to improve the breakdown voltage of the HEMT.

In order to cause the leakage current from the inversion layer P to flow to the chip end surfaces, the leakage current needs to pass through the first p-type semiconductor layer 23. In order to suppress the flow of the leakage current to the chip end surfaces, the first p-type semiconductor layer 23 is desirably long in the X direction as much as possible. However, the corner K located between the second upper portion $S_5$ and the side portion $\sigma_2$ is rounded by an etching process or an etchback process in some cases. Therefore, the first p-type semiconductor layer 23 is desirably set to be sufficiently long in the X direction, also in consideration of cases where the corner K is rounded.

Accordingly, the area $A_2$ in the present embodiment is set to be twice or more times as large as the area $A_1$. By this means, the present embodiment allows the first p-type semiconductor layer 23 to be set to be sufficiently long in the X direction.

As described above, the semiconductor device of the present embodiment includes the first pad layer 16 formed on the upper portion $S_1$ side of the semiconductor substrate 1, the second pad layer 22 formed on the lower portion $S_2$ side of the semiconductor substrate 1, and the first p-type semiconductor layer 23 formed between the second upper portion $S_5$ of the second pad layer 22 and the lower portion of the buffer layer 2.

Therefore, according to the present embodiment, the first and second pad layers 16 and 22 placed inside the chip make it possible to reduce the chip area of the semiconductor device.

In addition, according to the present embodiment, the first p-type semiconductor layer 23 formed between the second upper portion $S_5$ of the second pad layer 22 and the lower portion of the buffer layer 2 makes it possible to suppress the flow of the leakage current to improve the breakdown voltage of the HEMT.

Second Embodiment

Figure 2:
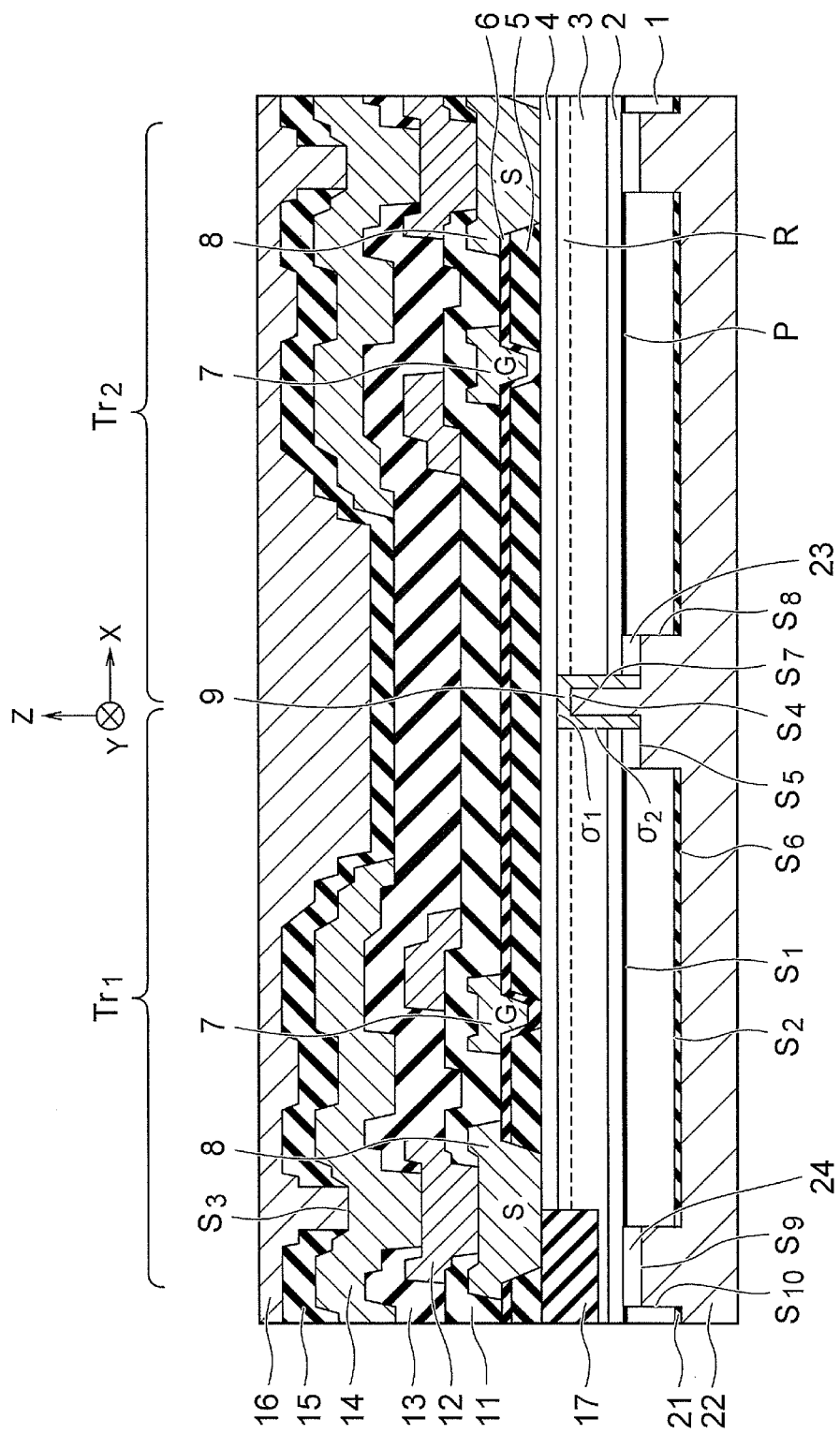
FIG. 2 is a cross-sectional view illustrating a structure of a semiconductor device of a second embodiment.

FIG. 2 is a cross-sectional view illustrating a structure of a semiconductor device of a second embodiment.

The second pad layer 22 of the present embodiment includes a fourth upper portion(s) $S_9$ provided at a level between the upper portion $S_1$ of a semiconductor substrate 1 and the lower portion $S_2$ of the semiconductor substrate 1, and provided in a position overlapped with the source electrode 8 in the Z direction, and a third side portion(s) $S_{10}$ located between the fourth upper portion $S_9$ and the third upper portion $S_6$. More specifically, the second pad layer 22 includes the fourth upper portion $S_9$ immediately below the source electrode 8.

The semiconductor device of the present embodiment includes, in addition to the first p-type semiconductor layer 23, a second p-type semiconductor layer(s) 24 as an example of a fourth semiconductor layer. The second p-type semiconductor layer 24 is formed between the fourth upper portion $S_9$ of the second pad layer 22 and the lower portion of the buffer layer 2. The second p-type semiconductor layer 24 is, for example, a silicon layer containing p-type impurities. The thickness of the second p-type semiconductor layer 24 in the Z direction is 1 μm or more for example, and preferably 3 μm or more.

For example, the second p-type semiconductor layer 24 can be formed by forming, in the lower portion $S_2$ of the semiconductor substrate 1, a third trench having a bottom between the upper portion $S_1$ and the lower portion $S_2$ of the semiconductor substrate 1 along with the first trench, and implanting the p-type impurities into the semiconductor substrate 1 at the bottoms of these trenches. In this case, the second p-type semiconductor layer 24 is a p-type semiconductor region formed in the semiconductor substrate 1. However, the second p-type semiconductor layer 24 may be formed by other methods.

In the present embodiment, the first p-type semiconductor layer 23 is formed around the drain electrode 9, and the second p-type semiconductor layer 24 is formed immediately below the source electrode 8. This makes it possible in the present embodiment to keep a leakage current generated in a transistor from flowing into another transistor.

For example, the flow of a leakage current from the transistor $Tr_1$ to the transistor $Tr_2$ can be suppressed by the first p-type semiconductor layer 23. In addition, the flow of a leakage current from the transistor $Tr_1$ to an unshown adjacent transistor and the flow of a leakage current from the transistor Tr$_2$ to an unshown adjacent transistor can be suppressed by the second p-type semiconductor layers 24.

Third Embodiment

Figure 3:
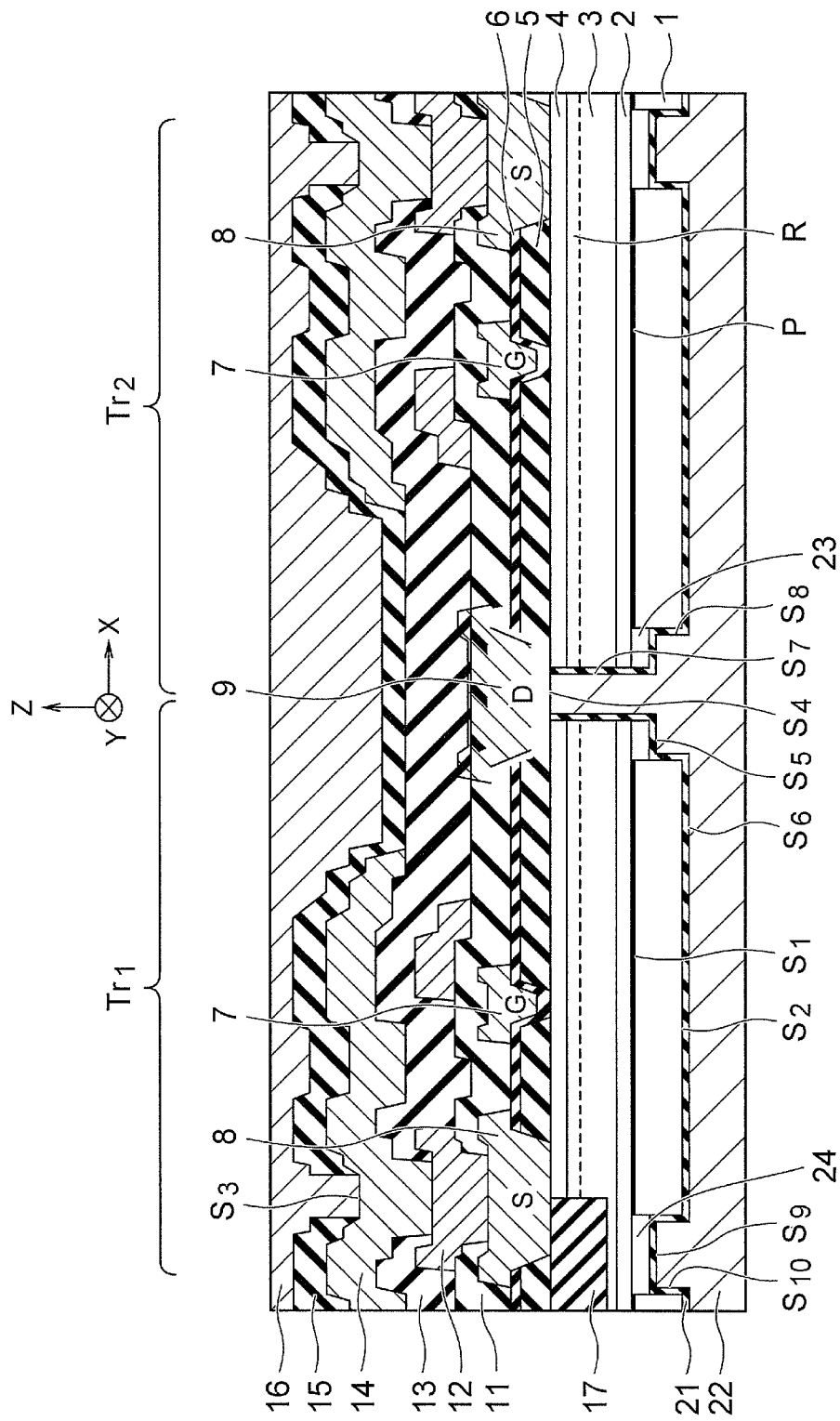
FIG. 3 is a cross-sectional view illustrating a structure of a semiconductor device of a third embodiment.

FIG. 3 is a cross-sectional view illustrating a structure of a semiconductor device of a third embodiment.

The drain electrode 9 of the present embodiment is formed on a side of the source electrode with respect to the electron supply layer 4. In other words, the drain electrode 9 of the present embodiment is placed in the +Z direction from the electron supply layer 4 along with the source electrode 8. Similarly to the source electrode 8, the drain electrode 9 of the present embodiment is formed directly on the electron supply layer 4 in an opening of the insulator 5, and is electrically connected to the electron supply layer 4 to form ohmic contact. The drain electrode 9 of the present embodiment is shaped to extend in the Y direction, similarly to the gate electrode 7 and the source electrode 8.

The second pad layer 22 of the present embodiment includes the first upper portion S$_4$ at the same level as the upper portion of the electron supply layer 4. As a result, the first upper portion S$_4$ of the second pad layer 22 is in contact with the drain electrode 9, so that the second pad layer 22 is electrically connected to the drain electrode 9.

The insulating layer 21 of the present embodiment is formed not only between the third upper portion S$_6$ and the lower portion S$_2$ of the semiconductor substrate 1, but also between the second upper portion S$_5$ and the lower portion of the first p-type semiconductor layer 23, and between the fourth upper portion S$_9$ and the lower portion of the second p-type semiconductor layer 24. The insulating layer 21 of the present embodiment is also formed between the first side portion S$_7$ and the electron supply layer 4, the electron transit layer 3, the buffer layer 2, and the first p-type semiconductor layer 23, between the second side portion S$_8$ and the semiconductor substrate 1, and between the third side portion S$_{10}$ and the semiconductor substrate 1.

In the present embodiment, although the source electrode 8 is electrically connected to first and second interconnect layers 12 and 14, the drain electrode 9 is not electrically connected to the first and second interconnect layers 12 and 14. The reason is that there is no need to electrically connect the drain electrode 9 to the first and second interconnect layers 12 and 14, because the drain electrode 9 is electrically connected to the second pad layer 22. Therefore, the semiconductor device of the present embodiment includes no interconnect of the first and second interconnect layers 12 and 14 immediately above the drain electrode 9. For example, this structure has an advantage that steps can be eliminated immediately above the drain electrode 9 to suppress abnormality occurrences such as step cuts of insulators or interconnects due to the steps.

For example, the insulating layer 21 of the present embodiment can be formed by carrying out the etching processes for forming the first to third trenches and the impurity implantation processes for forming the first and second p-type semiconductor layers 23 and 24, and then forming the insulating layer 21 over the entire surface of the semiconductor substrate 1 on the side of the lower portion S$_2$, and removing the insulating layer 21 under the drain electrode 9. However, the insulating layer 21 may be formed by other methods.

The semiconductor device of the present embodiment includes no interconnect of the first and second interconnect layers 12 and 14 immediately above the drain electrode 9. This structure is intended to suppress the abnormality occurrences due to the steps during the operation or the manufacture of the semiconductor device. In a case where these abnormality occurrences can be suppressed by other method, the semiconductor device of the present embodiment may include the interconnects of the first and second interconnect layers 12 and 14 immediately above the drain electrode 9.

According to the present embodiment, the insulating layer 21 makes it possible to prevent the leakage current at the interface between the semiconductor substrate 1 and the buffer layer 2 and at the interface between the buffer layer 2 and the electron transit layer 3 from flowing from the first and second p-type semiconductor layers 23 and 24 to the chip end surfaces through the second pad layer 22.

According to the present embodiment, the insulating layer 21 makes it possible to prevent the leakage current at the interface between the semiconductor substrate 1 and the buffer layer 2 from flowing into the second pad layer 22 through the first and second p-type semiconductor layers 23 and 24. In addition, according to the present embodiment, the insulating layer 21 makes it possible to prevent the leakage current at the interface between the buffer layer 2 and the electron transit layer 3 from flowing into the second pad layer 22 through the first side portion S$_7$.

The insulating layer 21 of the present embodiment is also applicable to the first and second embodiments.

Fourth Embodiment

Figure 4:
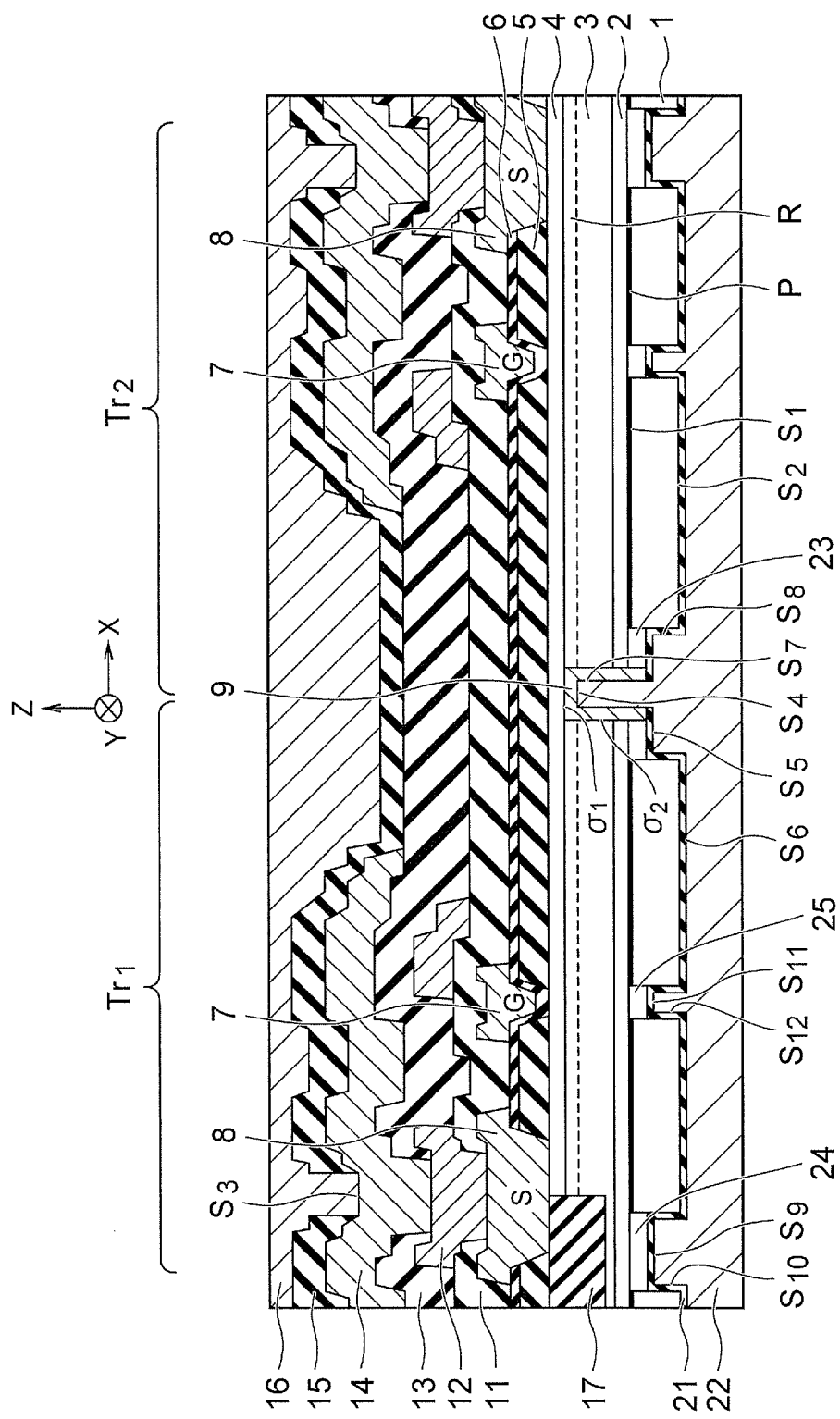
FIG. 4 is a cross-sectional view illustrating a structure of a semiconductor device of a fourth embodiment.

FIG. 4 is a cross-sectional view illustrating a structure of a semiconductor device of a fourth embodiment.

A second pad layer 22 of the present embodiment includes a fifth upper portion(s) S$_{11}$ provided at a level between the upper portion S$_1$ of the semiconductor substrate 1 and the lower portion S$_2$ of the semiconductor substrate 1, and provided in a position overlapped with the gate electrode 7 in the Z direction, and a fourth side portion(s) S$_{12}$ located between the fifth upper portion S$_{11}$ and the third upper portion S$_6$. More specifically, the second pad layer 22 includes the fifth upper portion S$_{11}$ immediately below the gate electrode 7.

The semiconductor device of the present embodiment includes, in addition to the first and second p-type semiconductor layers 23 and 24, a third p-type semiconductor layer(s) 25 as an example of a fifth semiconductor layer. The third p-type semiconductor layer 25 is formed between the fifth upper portion S$_{11}$ of the second pad layer 22 and the lower portion of the buffer layer 2. The third p-type semiconductor layer 25 is, for example, a silicon layer containing p-type impurities. The thickness of the third p-type semiconductor layer 25 in the Z direction is 1 µm or more for example, and preferably 3 µm or more.

For example, the third p-type semiconductor layer 25 can be formed by forming, in the lower portion S$_2$ of the semiconductor substrate 1, a fourth trench having a bottom between the upper portion S$_1$ and the lower portion S$_2$ of the semiconductor substrate 1 along with the first and third trenches, and implanting the p-type impurities into the semiconductor substrate 1 at the bottoms of these trenches. In this case, the third p-type semiconductor layer 25 is a p-type semiconductor region formed in the semiconductor substrate 1. However, the third p-type semiconductor layer 25 may be formed by other methods.

In the present embodiment, the first p-type semiconductor layer 23 is formed around the drain electrode 9, the second p-type semiconductor layer 24 is formed immediately below the source electrode 8, and the third p-type semiconductor layer 25 is formed immediately below the gate electrode 7. This makes it possible in the present embodiment to suppress the flow of the leakage current between the source electrode 8 and the drain electrode 9 in each transistor.

While the present embodiment is obtained by applying the third p-type semiconductor layer 25 to the second embodiment (however, the shape of an insulating layer 21 in the present embodiment is different from that in the second embodiment), the third p-type semiconductor layer 25 is also applicable to the first and third embodiments.

Figure 5:
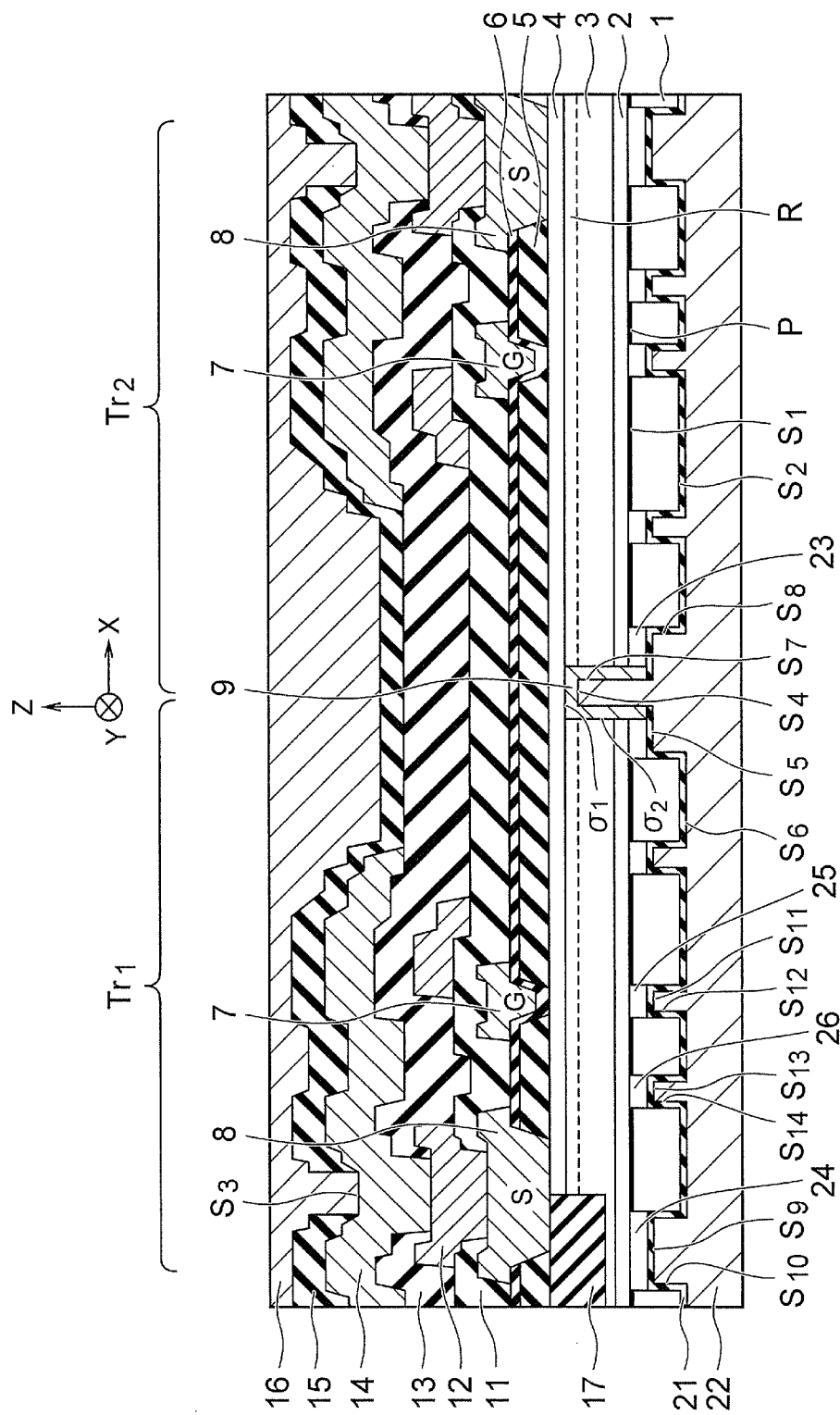
FIG. 5 is a cross-sectional view illustrating a structure of a semiconductor device of a modification of the fourth embodiment.

FIG. 5 is a cross-sectional view illustrating a structure of a semiconductor device of a modification of the fourth embodiment.

The second pad layer 22 of the present modification further includes a sixth upper portion(s) $S_{13}$ provided at a level between the upper portion $S_1$ of the semiconductor substrate 1 and the lower portion $S_2$ of the semiconductor substrate 1, and provided immediately below a region between the gate electrode 7 and the source electrode 8 or immediately below a region between the gate electrode 7 and the drain region 9, and a fifth side portion(s) $S_{14}$ located between the sixth upper portion $S_{13}$ and the third upper portion $S_6$.

The semiconductor device of the present embodiment includes, in addition to the first to third p-type semiconductor layers 23 to 25, a fourth p-type semiconductor layer(s) 26 as an example of a sixth semiconductor layer. The fourth p-type semiconductor layer 26 is formed between the sixth upper portion $S_{13}$ of the second pad layer 22 and the lower portion of the buffer layer 2. This makes it possible to suppress the flows of leakage currents between the gate electrode 7 and the source electrode 8 in each transistor, and between the gate electrode 7 and the drain electrode 9 in each transistor. For example, the fourth p-type semiconductor layer 26 can be formed by the same methods as in the cases of the first to third p-type semiconductor layers 23 to 25.

In the present modification, the sixth upper portions $S_{13}$ are provided immediately below the region between the gate electrode 7 and the source electrode 8, and immediately below the region between the gate electrode 7 and the drain region 9. However, the sixth upper portion $S_{13}$ may be provided immediately below either one of these regions.

Fifth Embodiment

Figure 6:
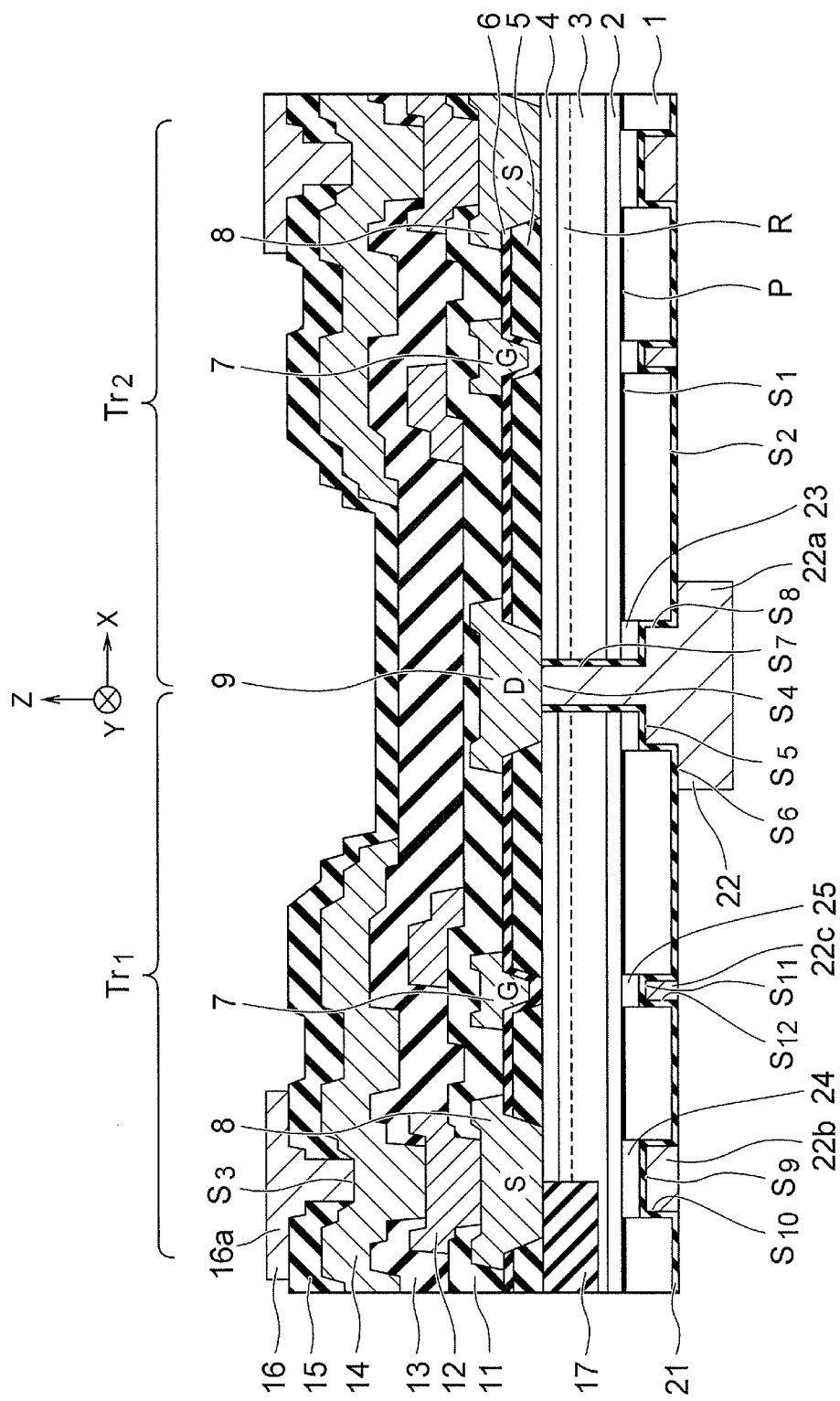
FIG. 6 is a cross-sectional view illustrating a structure of a semiconductor device of a fifth embodiment.

FIG. 6 is a cross-sectional view illustrating a structure of a semiconductor device of a fifth embodiment.

The first and second pad layers 16 and 22 of the first to fourth embodiments are respectively formed over the entire surfaces of the upper portion $S_1$ and the lower portion $S_2$ of the semiconductor substrate 1. Therefore, the first and second pad layers 16 and 22 of the first to fourth embodiments have shapes overlapped with the gate electrode 7, source electrode 8, and drain electrode 9 in the Z direction.

On the other hand, the first and second pad layers 16 and 22 of the present embodiment are processed to limit their pad areas to smaller areas.

The first pad layer 16 includes a first pad portion(s) 16a having a shape which is overlapped with the source electrode 8 in the Z direction, and is not overlapped with the gate electrode 7 and the drain electrode 9 in the Z direction.

The second pad layer 22 includes a second pad portion 22a having a shape which is overlapped with the drain electrode 9 in the Z direction, and is not overlapped with the gate electrode 7 and the source electrode 8 in the Z direction. The second pad layer 22 further includes a third pad portion(s) 22b including the fourth upper portion $S_9$, and a fourth pad portion(s) 22c including the fifth upper portion $S_{11}$. When there is the sixth upper portion $S_{13}$ as described above, a fifth pad portion(s) including the sixth upper portion $S_{13}$ is further formed.

The third and fourth pad portions 22b and 22c may be replaced by insulating layers. The same applies to the fifth pad portion(s).

In the present embodiment, a first pad portion 16a is electrically connected to a source electrode 8. However, a first pad portion 16a is electrically connected to plural source electrodes 8.

In the present embodiment, a second pad portion 22a is electrically connected to a drain electrode 9. However, a second pad portion 22a is electrically connected to plural drain electrodes 9.

As described above, the first and second pad layers 16 and 22 of the present embodiment are processed to limit their pad areas to smaller areas. Therefore, according to the present embodiment, when the first and second pad layers 16 and 22 are connected to an external device with wirings, it is possible to promote heat release from the chip, and to suppress warpage of the chip, for example.

While the present embodiment is obtained by applying the first and second pad portions 16a and 22a and the like to the third embodiment, the first and second pad portions 16a and 22a and the like are also applicable to the first, second, and fourth embodiments.

Sixth Embodiment

Figure 7:
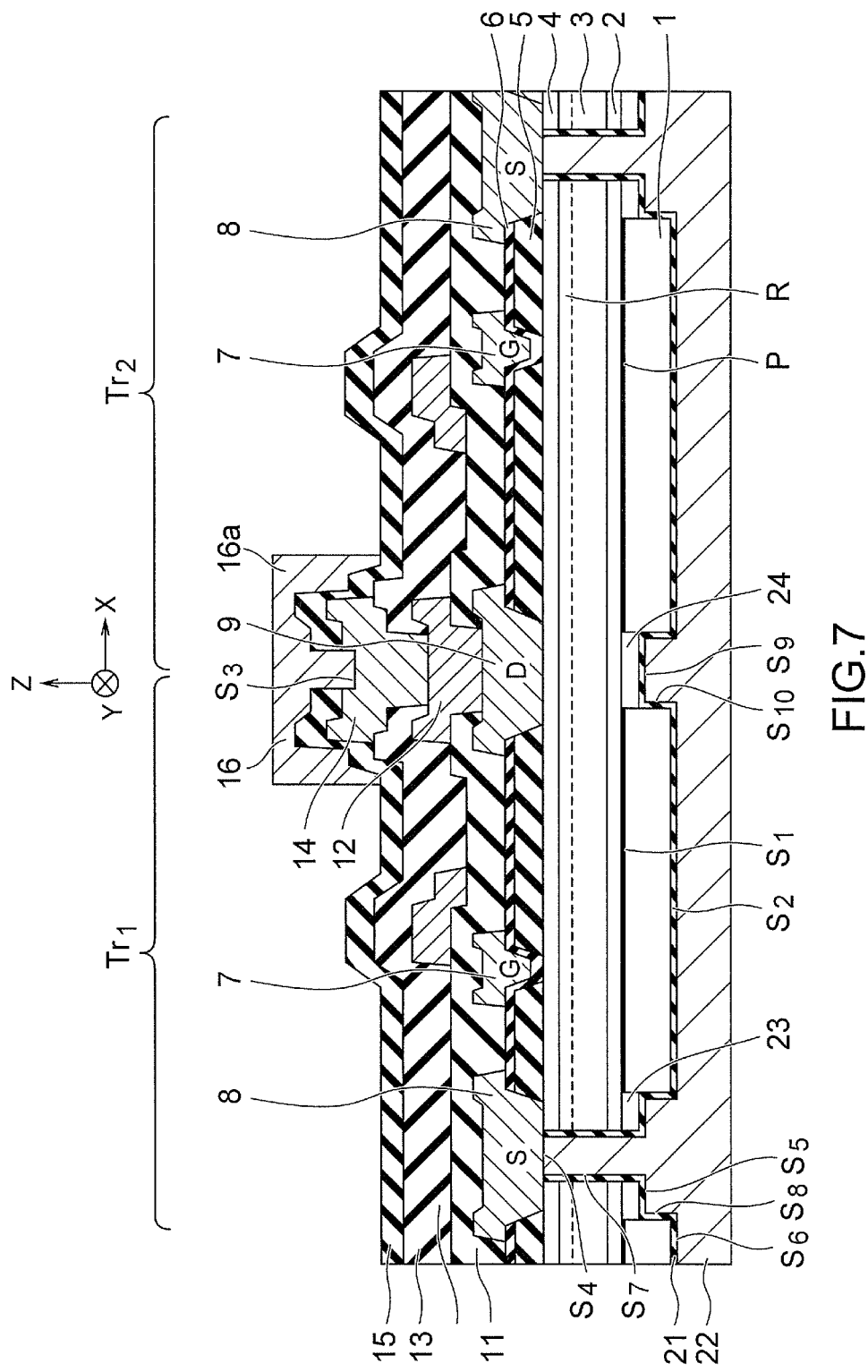
FIG. 7 is a cross-sectional view illustrating a structure of a semiconductor device of a sixth embodiment.

FIG. 7 is a cross-sectional view illustrating a structure of a semiconductor device of a sixth embodiment.

The first pad layer 16 of the present embodiment is electrically connected to the drain electrode 9 via the first and second interconnect layers 12 and 14. The drain electrode 9 in the present embodiment is an example of the first main electrode.

The second pad layer 22 of the present embodiment includes the first upper portion $S_4$ in contact with the source electrode 8, and is electrically connected to the source electrode 8. The source electrode 8 in the present embodiment is an example of the second main electrode.

In addition, the third upper portion $S_9$ in the present embodiment is formed in a position overlapped with the drain electrode 9 in the Z direction. More specifically, the third upper portion $S_9$ in the present embodiment is formed immediately below the drain electrode 9.

In the present embodiment, although the drain electrode 9 is electrically connected to first and second interconnect layers 12 and 14, the source electrode 8 is not electrically connected to the first and second interconnect layers 12 and 14. The reason is that there is no need to electrically connect the source electrode 8 to the first and second interconnect layers 12 and 14, because the source electrode 8 is electrically connected to the second pad layer 22. Therefore, the semiconductor device of the present embodiment includes no interconnect of the first and second interconnect layers 12 and 14 immediately above the source electrode 8. For example, this structure has an advantage that steps can be eliminated immediately above the source electrode 8 to suppress abnormality occurrences such as step cuts of insulators or interconnects due to the steps.

In this manner, the semiconductor device of the present embodiment include no interconnect of the first and second interconnect layers 12 and 14 immediately above the source electrode 8. This structure is intended to suppress the abnormality occurrences due to the steps during the operation or the manufacture of the semiconductor device. In a case where the abnormality occurrences can be suppressed by other method, the semiconductor device of the present embodiment may include interconnects of the first and second interconnect layers 12 and 14 immediately above the source electrode 8.

The present embodiment makes it possible to achieve the reduction in chip area and the improved breakdown voltage of the HEMT, for the same reasons as in the first to fifth embodiments.

Seventh Embodiment

Figure 8:
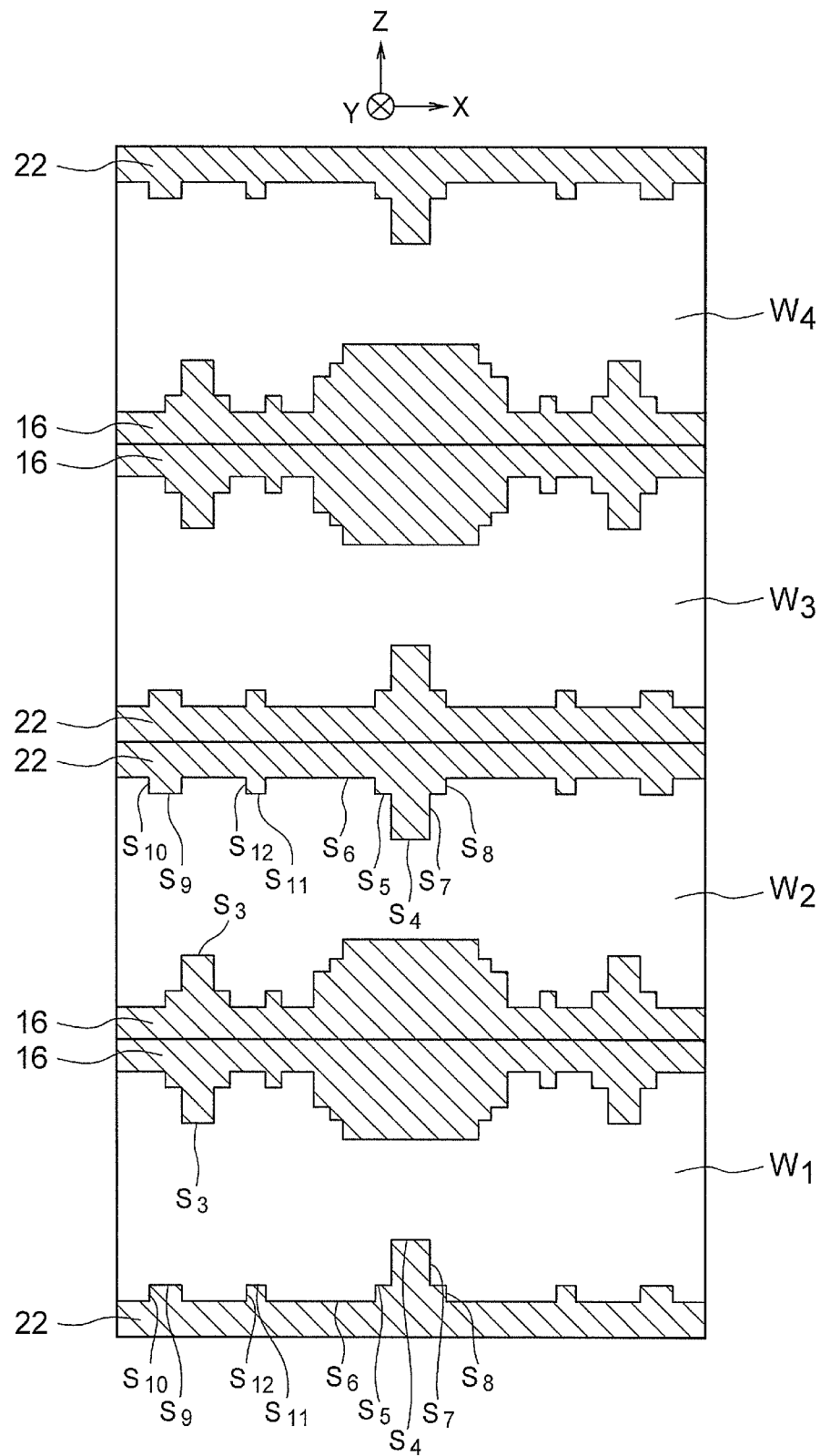
FIG. 8 is a cross-sectional view schematically illustrating a structure of a semiconductor device of a seventh embodiment.

FIG. 8 is a cross-sectional view schematically illustrating a structure of a semiconductor device of a seventh embodiment.

The semiconductor device in FIG. 8 includes wafer chips $W_1$ to $W_4$ stacked in the Z direction and bonded to each other. While FIG. 8 shows the four wafer chips $W_1$ to $W_4$, the number of the wafer chips forming the semiconductor device of the present embodiment may be any number other than 4.

Each of the wafer chips $W_1$ to $W_4$ corresponds to the semiconductor device shown in FIG. 4. Therefore, each of the wafer chips $W_1$ to $W_4$ includes the first pad layer 16 including the lower portion $S_3$, and the second pad layer 22 including the first to fifth upper portions $S_4$, $S_5$, $S_6$, $S_9$ and $S_{11}$ and the first to fourth side portions $S_7$, $S_8$, $S_{10}$ and $S_{12}$. The illustration of the other components of the wafer chips $W_1$ to $W_4$ is omitted for simplification of the drawing.

The wafer chips $W_1$ and $W_2$ are stacked so that the first pad layer 16 of the wafer chip $W_1$ is in contact with the first pad layer 16 of the wafer chip $W_2$. The wafer chips $W_2$ and $W_3$ are stacked so that the second pad layer 22 of the wafer chip $W_2$ is in contact with the second pad layer 22 of the wafer chip $W_3$. The wafer chips $W_3$ and $W_4$ are stacked so that the first pad layer 16 of the wafer chip $W_3$ is in contact with the first pad layer 16 of the wafer chip $W_4$.

In this manner, the wafer chips mutually adjacent to each other in the present embodiment are stacked so that the first pad layers 16 are in contact with each other, or the second pad layers 22 are in contact with each other.

In this specification, the state of a wafer chip which has the same orientation as that of the semiconductor device in FIG. 4 is described as face-up, whereas the state of a wafer chip which has the orientation opposite to that of the semiconductor device in FIG. 4 is described as face-down.

Therefore, the states of the wafer chips $W_1$ and $W_3$ are described as face-up, whereas the states of the wafer chips $W_2$ and $W_4$ are described as face-down. In the semiconductor device of the present embodiment, the face-up wafer chips $W_1$ and $W_3$ and the face-down wafer chips $W_2$ and $W_4$ are stacked alternately.

The expressions of the lower portion $S_3$ and the upper portions $S_4$, $S_5$, $S_6$, $S_9$ and $S_{11}$ are determined on the assumption of a case where the wafer chips $W_1$ to $W_4$ have the face-up states. Therefore, in the face-down wafer chips $W_2$ and $W_4$, the lower portion $S_3$ is located above, whereas the upper portions $S_4$, $S_5$, $S_6$, $S_9$ and $S_{11}$ are located below.

The semiconductor device of the present embodiment allows a conduction test such as burn-in to be efficiently carried out on the wafer chips $W_1$ to $W_4$, and allows the wafer chips $W_1$ to $W_4$ to function as one semiconductor device.

The semiconductor device of the present embodiment includes the plurality of wafer chips each corresponding to the semiconductor device of the fourth embodiment. However, the semiconductor device of the present embodiment may instead include a plurality of wafer chips corresponding to one of the semiconductor devices of the first to third embodiments.

Figure 9:
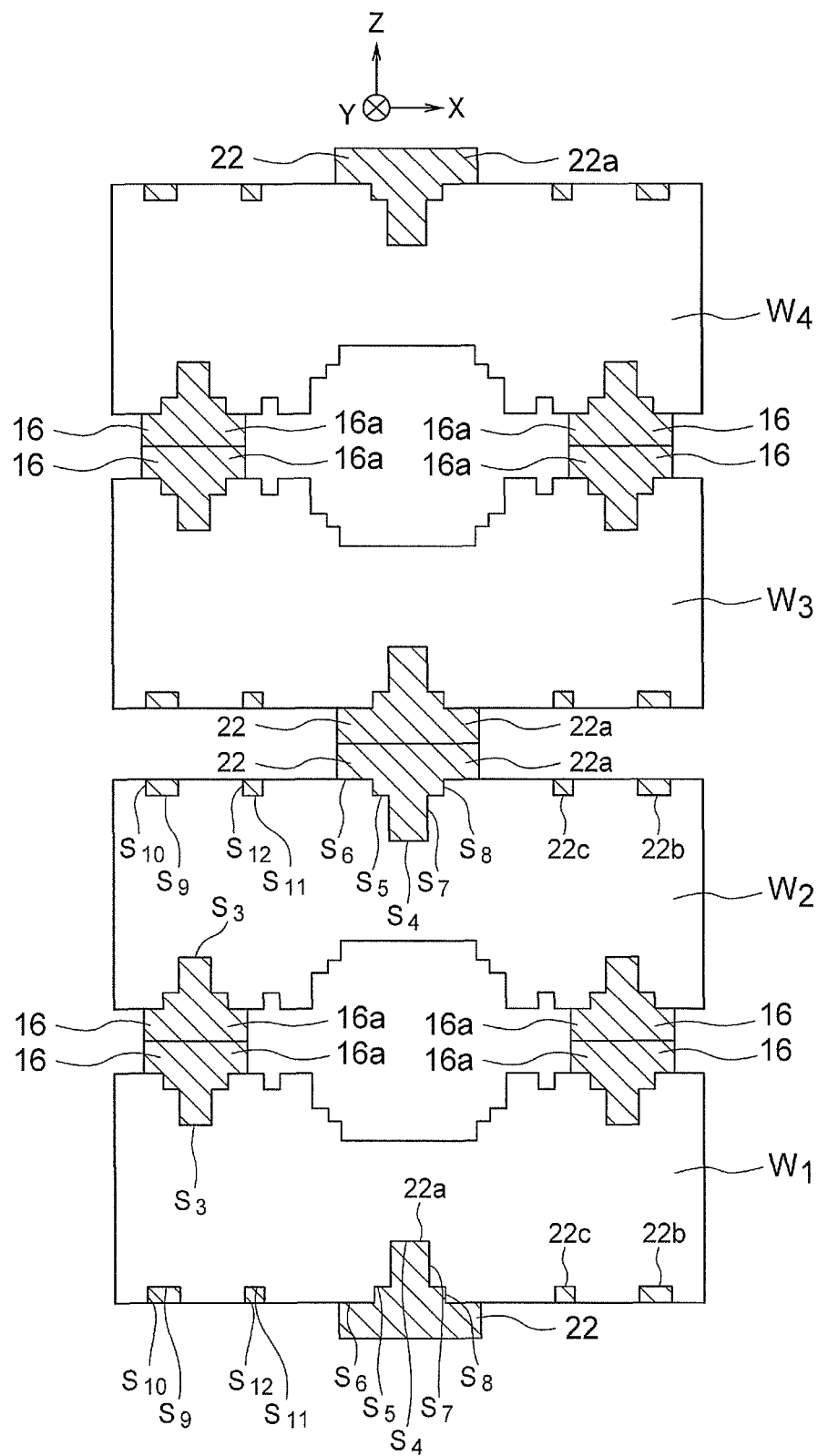
FIG. 9 is a cross-sectional view schematically illustrating a structure of a semiconductor device of a modification of the seventh embodiment.

FIG. 9 is a cross-sectional view schematically illustrating a structure of a semiconductor device of a modification of the seventh embodiment.

The semiconductor device in FIG. 9 includes the wafer chips $W_1$ to $W_4$ stacked in the Z direction and bonded to each other. Each of the wafer chips $W_1$ to $W_4$ corresponds to the semiconductor device shown in FIG. 6. Therefore, each of the wafer chips $W_1$ to $W_4$ include the first pad layer 16 including the first pad portion 16a, and the second pad layer 22 including the second pad portion 22a.

The wafer chips $W_1$ and $W_2$ are stacked so that the first pad portion 16a of the wafer chip $W_1$ is in contact with the first pad portion 16a of the wafer chip $W_2$. The wafer chips $W_2$ and $W_3$ are stacked so that the second pad portion 22a of the wafer chip $W_2$ is in contact with the second pad layer 22a of the wafer chip $W_3$. The wafer chips $W_3$ and $W_4$ are stacked so that the first pad portion 16a of the wafer chip $W_3$ is in contact with the first pad portion 16a of the wafer chip $W_4$.

In this manner, the wafer chips mutually adjacent to each other in the present embodiment are stacked so that the first pad portions 16a are in contact with each other, or the second pad portions 22a are in contact with each other.

The semiconductor device of the present embodiment has cavities between adjacent wafer chips, because the first and second pad layers 16 and 22 of the wafer chips $W_1$ to $W_4$ of the present embodiment are processed to limit their pad areas to smaller areas. Therefore, the semiconductor device of the present embodiment makes it possible to promote heat release from the chips, and suppress warpage of the chips.

The semiconductor device of the present embodiment includes the plurality of wafer chips each corresponding to the semiconductor device of the fifth embodiment. However, the semiconductor device of the present embodiment may instead include a plurality of wafer chips corresponding to the semiconductor device of the sixth embodiment.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a semiconductor substrate;
   a first film disposed above the semiconductor substrate;
   a first semiconductor layer of a first conductivity type or an intrinsic type disposed above the first film;
   a second semiconductor layer of the first conductivity type or the intrinsic type disposed above the first semiconductor layer;
   a first main electrode disposed above the second semiconductor layer;
   a second main electrode disposed above the second semiconductor layer and on a side of the first main electrode with respect to the second semiconductor layer;
   a control electrode disposed above the second semiconductor layer via an insulator in between the first and second main electrodes;
   a first pad layer electrically connected to the first main electrode;
   a second pad layer electrically connected to the second main electrode, and including a first upper portion in contact with the second main electrode, a second upper portion disposed at a level between an upper portion of the semiconductor substrate and a lower portion of the semiconductor substrate, and a third upper portion opposed to the lower portion of the semiconductor substrate via an insulating layer;

a third semiconductor layer of a second conductivity type disposed between the second upper portion of the second pad layer and a lower portion of the first film;

wherein the first pad layer includes a first pad portion having a shape which is overlapped with the first main electrode in a direction perpendicular to the upper and lower portions of the semiconductor substrate, and is not overlapped with the second main electrode and the control electrode in the direction perpendicular to the upper and lower portions of the semiconductor substrate.

2. The device of claim 1, wherein the insulating layer is disposed between the third semiconductor layer and the second pad layer.

3. The device of claim 1, wherein a thickness of the third semiconductor layer is preferably 3 um.

4. The device of claim 1, wherein the third semiconductor layer is formed of a same semiconductor material as the semiconductor substrate, and contains impurities of the second conductivity type.

5. The device of claim 1, wherein the second pad layer includes a fourth upper portion disposed at a level between the upper portion of the semiconductor substrate and the lower portion of the semiconductor substrate, and disposed in a position overlapped with the first main electrode in a direction perpendicular to the upper and lower portions of the semiconductor substrate, and the device further comprises a fourth semiconductor layer of the second conductivity type disposed between the fourth upper portion of the second pad layer and the lower portion of the first film.

6. The device of claim 5, wherein the insulating layer is disposed between the fourth semiconductor layer and the second pad layer.

7. The device of claim 1, wherein a thickness of the fourth semiconductor layer is preferably 3 um.

8. The device of claim 5, wherein the fourth semiconductor layer is formed of a same semiconductor material as the semiconductor substrate, and contains impurities of the second conductivity type.

9. The device of claim 1, wherein the second pad layer has a shape which is overlapped with the first main electrode, the second main electrode, and the control electrode in a direction perpendicular to the upper and lower portions of the semiconductor substrate.

* * * * *